United States Patent
Fukuda

(10) Patent No.: US 10,243,326 B2
(45) Date of Patent: Mar. 26, 2019

(54) SEMICONDUCTOR LASER, LIGHT SOURCE UNIT, AND LASER LIGHT IRRADIATION DEVICE

(71) Applicant: Renesas Electronics Corporation, Tokyo (JP)

(72) Inventor: Kazuhisa Fukuda, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

(21) Appl. No.: 15/800,778

(22) Filed: Nov. 1, 2017

(65) Prior Publication Data

US 2018/0152001 A1 May 31, 2018

(30) Foreign Application Priority Data

Nov. 25, 2016 (JP) .................. 2016-228526

(51) Int. Cl.
| | |
|---|---|
| H01S 5/10 | (2006.01) |
| H01S 5/343 | (2006.01) |
| H01S 5/00 | (2006.01) |
| H01S 5/02 | (2006.01) |
| H01S 5/028 | (2006.01) |
| H01S 5/042 | (2006.01) |
| H01S 5/22 | (2006.01) |
| H01S 5/30 | (2006.01) |

(52) U.S. Cl.
CPC .......... H01S 5/1014 (2013.01); *H01S 5/0021* (2013.01); *H01S 5/0202* (2013.01); *H01S 5/0287* (2013.01); *H01S 5/0425* (2013.01); *H01S 5/1039* (2013.01); *H01S 5/22* (2013.01); *H01S 5/3063* (2013.01); *H01S 5/3434* (2013.01); *H01S 5/34333* (2013.01)

(58) Field of Classification Search
CPC ......... H01S 5/1014; H01S 5/3434; H01S 5/00
See application file for complete search history.

(56) References Cited

U.S. PATENT DOCUMENTS

| | | | |
|---|---|---|---|
| 6,798,815 B2 | 9/2004 | Schmidt et al. | |
| 6,928,097 B2 | 8/2005 | Chida | |
| 2015/0146757 A1* | 5/2015 | Ohki | .................... H01S 5/02284 |
| | | | 372/50.11 |
| 2017/0288364 A1* | 10/2017 | Hemenway | ........... H01S 5/2036 |

FOREIGN PATENT DOCUMENTS

| | | |
|---|---|---|
| JP | 2003-101139 A | 4/2003 |
| JP | 2005-524234 A | 8/2005 |

* cited by examiner

*Primary Examiner* — Dung Nguyen
(74) *Attorney, Agent, or Firm* — Sughrue Mion, PLLC

(57) ABSTRACT

A waveguide includes a narrow waveguide, wide waveguides, and tapered waveguides. A width Ww of the wide waveguides is wider than A width Wn of the narrow waveguide. The tapered waveguides have their width continuously varying so as to couple the narrow waveguide and the wide waveguides, respectively. Assuming a length of the waveguide as L and an area as S, $Ks=S/(Wn \cdot L)$ and $1 < ks \le 1.5$ are satisfied.

12 Claims, 12 Drawing Sheets

SEMICONDUCTOR LASER, LIGHT SOURCE UNIT, AND LASER LIGHT IRRADIATION DEVICE

CROSS-REFERENCE TO RELATED APPLICATIONS

The disclosure of Japanese Patent Application No. 2016-228526 filed on Nov. 25, 2016 including the specification, drawings and abstract is incorporated herein by reference in its entirety.

BACKGROUND

The present invention relates to a semiconductor laser, a light source unit, and a laser light irradiation device.

A nitride semiconductor laser has been developed as a pick-up light source for a high-density optical disc and the like, and is recently deployed in various fields such as a projector, lighting, processing equipment, and the like, which require even higher output power. Especially in the processing applications including a precise measurement instrument for sensing or analyzation, a printing or exposure device, and a 3D printer, with requirements for high speed and high definition, it is required to achieve high power while retaining high beam quality.

In an application that requires high beam quality, a semiconductor laser of the type called a single transverse mode laser having a narrow refractive index waveguide structure as a light containment structure in a horizontal direction is commonly used. This laser oscillates a laser beam in a basic mode alone by cutting off a transverse higher mode of light by narrowing the waveguide, and thus makes it possible to constantly obtain a single-peaked beam intensity distribution. On the other hand, because the waveguide has a narrow width, a beam spot size of the end face is reduced to increase a light density on an emission end face, resulting that an upper limit of the light output is mainly limited by optical breaking strength of the end face.

As a method of improving the light output of the semiconductor laser, it is known to increase the beam spot size by extending the waveguide width. However, by simply extending the waveguide width, not only the single-peaked basic mode but also higher-order modes are allowed, which may degrade the beam quality.

As a method of increasing the output while retaining the single-peaked beam shape, the tapered waveguide structure is known in which the waveguide width is extended only in the end face portion (see, Japanese Unexamined Patent Application Publication No. 2003-101139 and Japanese Translation of PCT International Application Publication No. 2005-524234). The tapered waveguide structure is provided with a wide waveguide that allows for a higher mode near an end face, a narrow waveguide that allows for a basic mode alone at the center of a laser element, and further a tapered waveguide that smoothly couples the narrow waveguide and the wide waveguide. With the tapered waveguide structure, it is possible to minimize a waveguide loss in the basic mode while allowing the narrow waveguide to function as a filter preventing propagation of the higher mode by appropriately designing the dimension of the tapered waveguide. This makes it possible to increase the beam spot size without increasing an operating current compared with a related-art single-mode laser.

SUMMARY

However, the inventors reviewed a current-light output (I-L) property of the laser introduced with the above-mentioned tapered waveguide structure to find out that degradation may occur to the current-light output (I-L) property. FIG. 15 shows the current-light output (I-L) property of the laser introduced with a typical tapered waveguide structure. In FIG. 15, a dashed line indicates the current-light output (I-L) property and a solid line indicates its differential curve dL/dI (hereinbelow, "slope efficiency"). As shown in FIG. 15, such a laser involves a problem that a bend (kink) may occur to lower the slope efficiency. It became apparent that, as a result, a stable high-power operation is not feasible.

It is known that the bend in the current-light output (I-L) property called "kink" is generally caused by a mode instability resulting from spatial hole burning. This is explained by a mechanism that, in a state of oscillating a laser of the basic mode, a local carrier consumption occurs in the center of the waveguide where the photon density is the highest, thus the horizontal gain and the refractive index distribution change and the higher mode easily occurs. Therefore, the beam after the kink occurs (far-field image or near-field image) is not the single-peaked shape of the basic mode but a mixed waveform of the higher modes such as a primary mode and a secondary mode. Furthermore, in order to improve the kink light output Pkink that is the light output in which the kink occurs, it is believed to be effective to weaken the light containment of the basic mode by reducing a horizontal refractive index difference (Δn) of the waveguide.

The inventors then examined the kink of the laser introduced with the above-mentioned tapered waveguide structure. FIG. 16 shows a far-field image of a laser light emitted from a semiconductor laser introduced with a typical tapered waveguide structure. In FIG. 16, the far-field image in the horizontal direction is denoted by FFPH, and the far-field image in the perpendicular direction is denoted by FFPV. As shown in FIG. 16, the far-field image FFPH in the horizontal direction at the kink light output Pkink or higher (for example, 300 [mW] light output in FIG. 15) shows a single peak as with the far-field image of the common basic mode, where the waveform mixed with the higher modes is not observed. The improvement of the kink light output Pkink due to reduction of the horizontal refractive index difference (Δn) is not observed either.

From the above, the mechanism of occurrence of the kink in the semiconductor laser having the tapered waveguide structure is different from that of the generally known kink, and it is considered that occurrence of the super luminescence in the wide waveguide near the end face is concerned, as described below.

Because the higher mode is allowed in the wide waveguide and the tapered waveguide arranged near the end face, it is considered that, when a spontaneous emission (ASE: Amplified Spontaneous Emission) reaches a level that causes a stimulated emission into a superluminescent state due to increase of flowed current, there is caused a tradeoff between the speed of the stimulated emission contributing to the basic mode and the speed of the stimulated emission contributing to the higher mode. As the stimulated emission by the ASE in the wide waveguide becomes more apparent and its light intensity increases with further increase of the current, the carrier consumption occurs in the wide waveguide and the tapered waveguide due to the stimulated emission of the higher mode and carriers are quickly consumed, thereby lowering efficiency of the basic mode. In the semiconductor laser with the tapered waveguide structure, a kink is generated by the super luminescence occurring in the wide waveguide and the tapered waveguide, and the lower slope efficiency after occurrence of the kink corresponds to the fact that the flowed carriers are consumed by the super luminescence of the higher mode. Described above is the mechanism of occurrence of the kink in the semiconductor laser having the tapered waveguide structure.

Other problems and novel features will be apparent from description herein and accompanying drawings.

According to one embodiment, a semiconductor laser includes a first waveguide having a first width, a second waveguide extending from a first end face of a resonator and having a second width, a third waveguide extending from a second end face of the resonator and having the second width, a first tapered waveguide continuously varying its width so as to couple the first waveguide and the second waveguide, and a second tapered waveguide continuously varying its width so as to couple the first waveguide and the third waveguide, wherein, assuming the first width as Wn, a length of the resonator as L, a total area of the first to third waveguides and the first and second tapered waveguides as S, Ks=S/(Wn·L) and 1<ks≤1.5 are satisfied.

According to one embodiment, it is possible to improve quality and output of a laser light from a semiconductor laser having a tapered waveguide structure.

DETAILED DESCRIPTION

Hereinbelow, embodiments of the present invention will be described with reference to drawings. It should be noted that like components are denoted by like numerals throughout the drawings and the explanation thereof may not be repeated as appropriate.

First Embodiment

Figure 1:
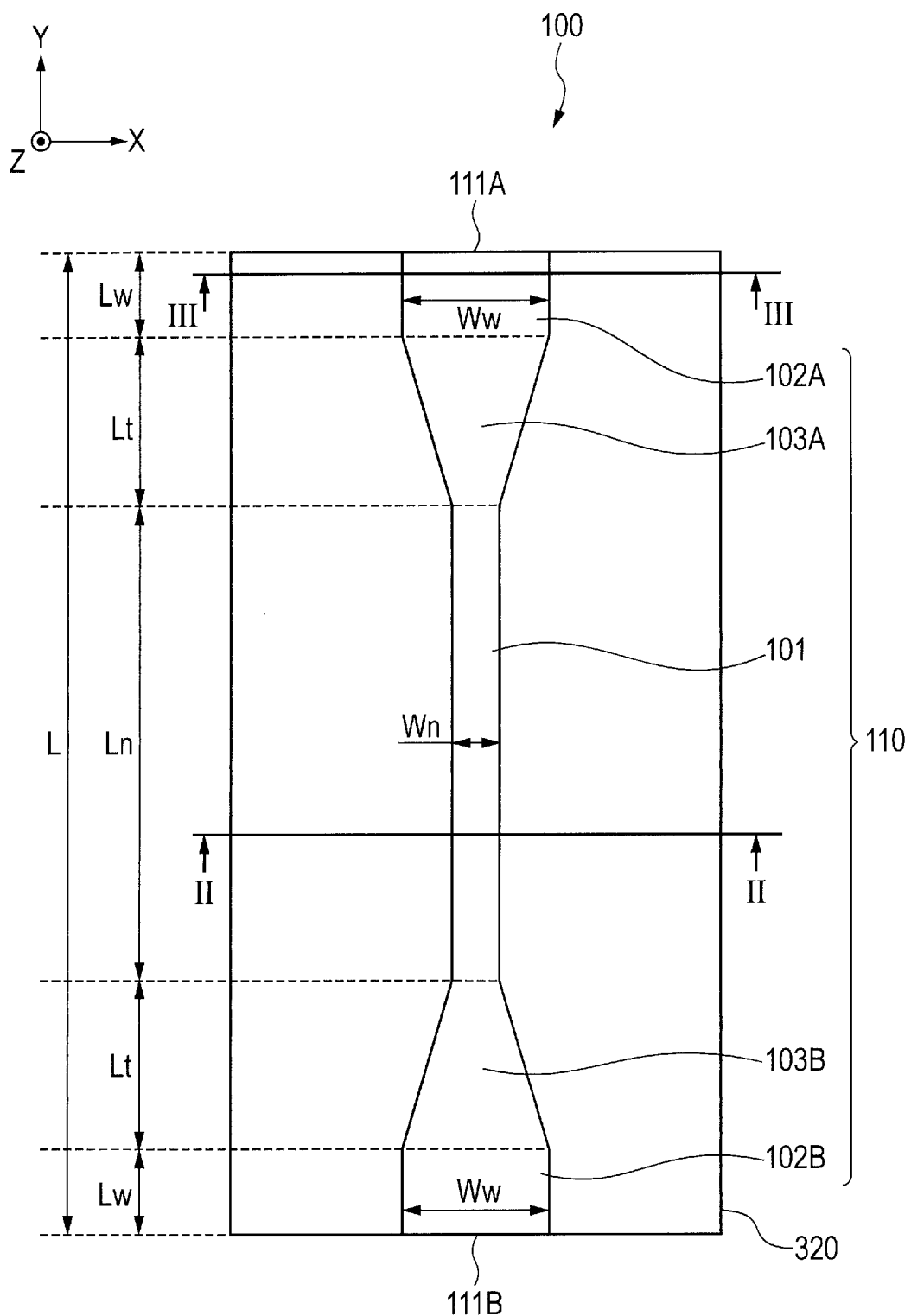
FIG. 1 is a top view schematically showing a configuration of a semiconductor laser according to a first embodiment.
Figure 2:
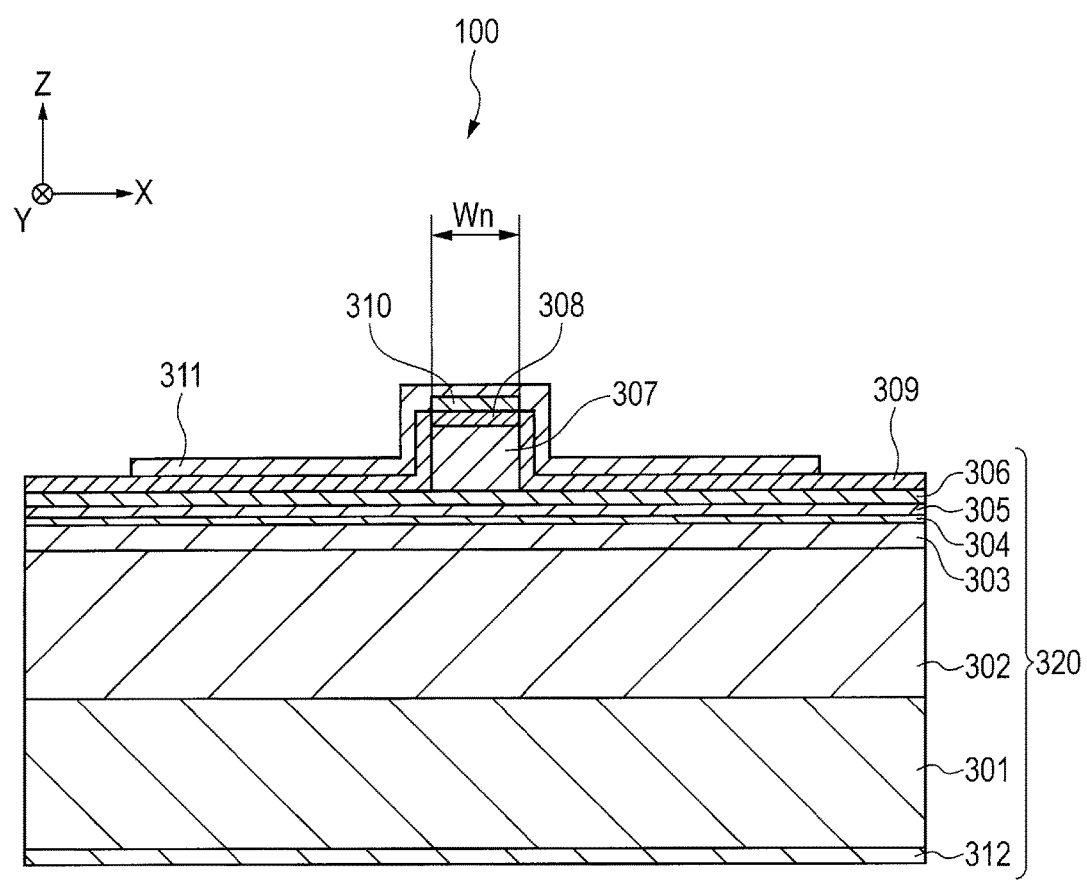
FIG. 2 is a sectional view of the semiconductor laser taken along II-II in FIG. 1.
Figure 3:
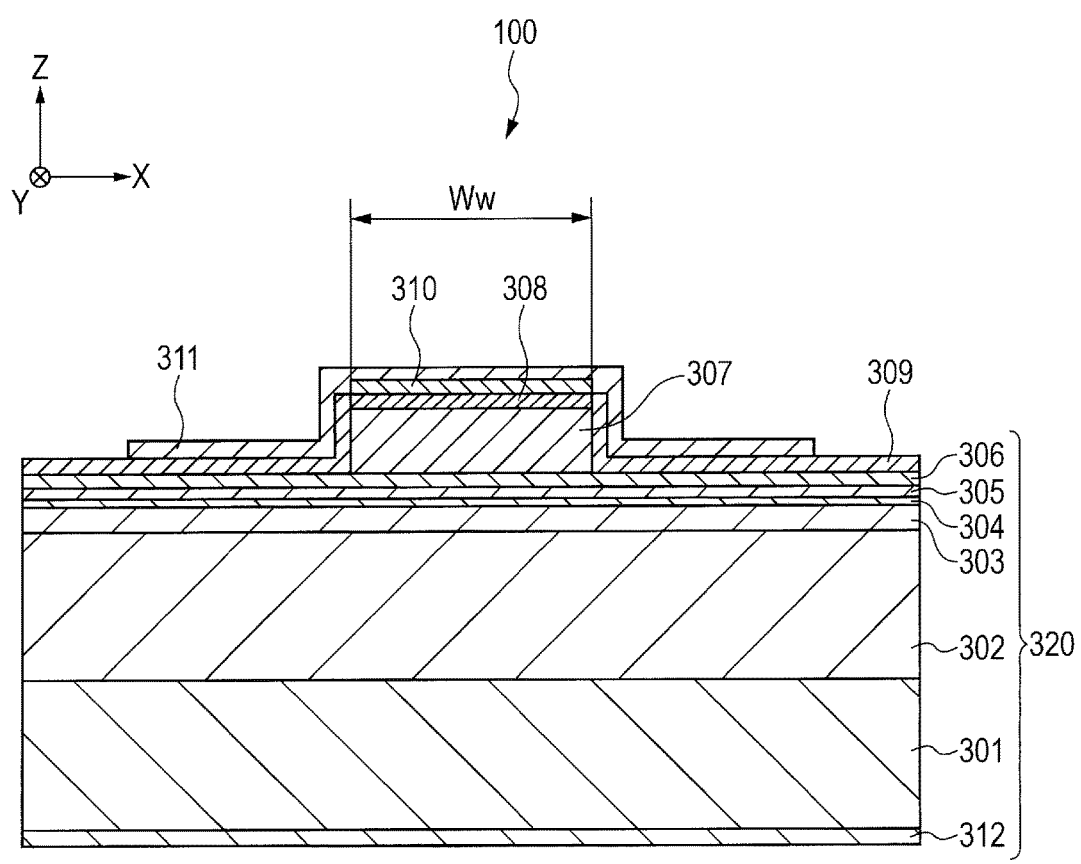
FIG. 3 is a sectional view of the semiconductor laser taken along III-III in FIG. 1.

A semiconductor laser 100 according to a first embodiment is described below. The semiconductor laser 100 is configured as a nitride semiconductor-based 405 nm band blue-violet laser. FIG. 1 is a top view schematically showing a configuration of the semiconductor laser 100 according to the first embodiment. FIG. 2 is a sectional view of the semiconductor laser 100 taken along II-II in FIG. 1. FIG. 3 is a sectional view of the semiconductor 100 laser taken along III-III in FIG. 1.

The horizontal direction on the pages of FIGS. 1 to 3 is regarded as an X direction herein. A vertical direction on the page of FIG. 1 and a direction perpendicular to the pages of FIGS. 2 and 3 are regarded as a Y direction. A direction perpendicular to the page of FIG. 1 and a vertical direction on the pages of FIGS. 2 and 3 are regarded as a Z direction. In FIG. 1, for easy understanding of the structure of the waveguide, descriptions of an insulating film, an electrode, and the like are omitted.

First, a planar configuration of the semiconductor laser 100 is described with reference to FIG. 1. The semiconductor laser 100 includes, as described later, a waveguide 110 that configures a resonator formed over a semiconductor substrate 320 having an X-Y plane as a main surface. In this embodiment, the waveguide 110 is configured as a ridge stripe formed over the semiconductor substrate 320. Herein, a length of the waveguide 110 in the resonance direction or waveguide direction, namely in the Y direction, is denoted by L.

A resonator end face 111A is provided at one end of the waveguide 110 and a resonator end face 111B is provided at the other end of the waveguide 110. Each resonator end face is formed by cleavage, where a low reflection film is formed over the resonator end face 111A on the emission end face side and a high reflection film is formed over the resonator end face 111B on the opposite end face side. For example, $SiO_2$ may be used as the low reflection film and a multi-layer film including of $SiO_2$ and $TiO_2$ may be used as the high reflection film. It is preferable to select a film structure and a layer structure so that a reflectance of the low reflection film is, for example, 20% or lower and the reflectance of the high reflection film is, for example, 80% or higher at a desired emission wavelength.

The waveguide 110 is configured by five elements including a narrow waveguide 101, wide waveguides 102A and 102B, and tapered waveguides 103A and 103B.

The narrow waveguide 101 (hereinbelow, also referred to as "first waveguide") is designed as a waveguide that allows only a basic mode in the horizontal direction (i.e., X direction in FIG. 1) with the length in the Y direction being Ln and the width in the X direction being Wn (hereinbelow, also referred to as "first width"). The width Wn of the narrow waveguide 101 is preferably no less than 1.0 μm and no higher than 1.6 μm (1.0 μm≤Wn≤1.6 μm) because it is preferred that the higher mode is cut off allowing only for the basic mode. The reason is described below.

The width that cuts off the higher mode can be estimated by a horizontal refractive index difference Δn. To obtain a stable basic mode with a refractive index guide structure, Δn needs to be designed to be larger than an amount of the refractive index reduced by the plasma effect of the flowed carrier and, when the material of the semiconductor laser is based on the nitride semiconductor, it is preferably 0.003 or higher ($\Delta n \geq 0.003$). The cutoff width is 1.64 µm in this case. On the other hand, when $\Delta n$ is too large, the cutoff width is narrow and it is difficult to manufacture, and thus the upper limit value of $\Delta n$ is preferably on the order of 0.005 ($\Delta n \geq 0.005$) so that the cutoff width may be 1.2 µm or larger. From the above, by setting the width Wn of the narrow waveguide 101 to no less than 1.0 µm and no higher than 1.6 µm (1.0 µm≤Wn≤1.6 µm), the narrow waveguide 101 can be made as a waveguide that can cut off the higher mode with the horizontal refractive index difference $\Delta n$ ranging from 0.003 to 0.005 (0.003≤$\Delta n$≤0.005).

The waveguides 102A (hereinbelow, also referred to as "second waveguide") and 102B (hereinbelow, also referred to as "second waveguide") are formed as waveguides each having a length Lw in the Y direction, a width Ww in the X direction (hereinbelow, also referred to as "second width") and allowing the higher mode in the horizontal direction (i.e., the X direction in FIG. 1).

The tapered waveguide 103A is formed as a waveguide with its width varying between Wn and Ww so as to smoothly couple the narrow waveguide 101 and the wide waveguide 102A and having a tapered shape with its length Lt in the Y direction. The tapered waveguide 103B is formed as a waveguide with its width continuously varying so as to smoothly couple the narrow waveguide 101 and the wide waveguide 102B and having a tapered shape with its length Lt in the Y direction.

Exemplary dimensions of each portion of the semiconductor laser 100 may include, for example, L=800 µm, Wn=1.25 µm, Ln=320 µm, Ww=4 um, Lw=40 µm, and Lt=200 µm. In this case, based on the beam propagation method, the combining efficiency of the basic mode is 99.9%, which achieves a desirable waveguide structure presenting very little loss.

Figure 4:
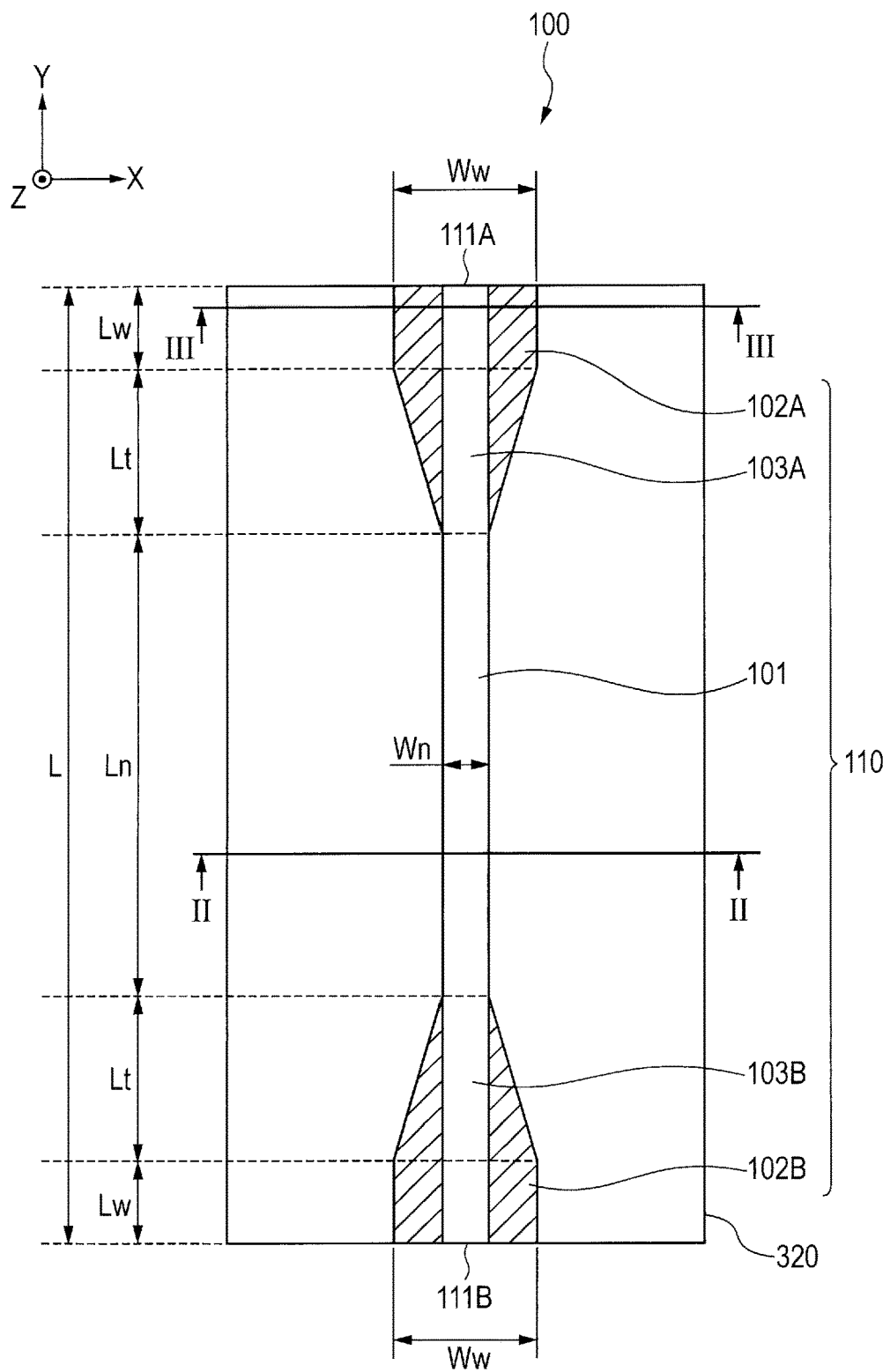
FIG. 4 is a top view schematically showing the configuration of the semiconductor laser according to the first embodiment.

FIG. 4 is a top view schematically showing the configuration of the semiconductor laser 100 according to the first embodiment. In FIG. 4, areas to be calculated in association with an area of the waveguide, which are described below, are hatched.

The total area S of the waveguide 110 is expressed by Formula (1) below.

$$S = (Ww - Wn) \times (Lt + 2 \times Lw) + Wn \times L \quad (1)$$

A ratio of the area of the waveguide 110 divided by a product Wn×L of the width Wn of the narrow waveguide 101 and the length L of the waveguide 110 (corresponding to a proportion of the hatched area in FIG. 4) is defined as ks as expressed by Formula (2).

$$ks = S/(Wn \cdot L) \quad (2)$$

In this embodiment, Ww, Lt, Lw, and L are designed so that the ratio ks is larger than 1 and also no larger than 1.5, as indicated by Formula (3).

$$1 < ks \leq 1.5 \quad (3)$$

The width Ww of the wide waveguides 102A and 102B is larger than the width Wn of the narrow waveguide 101 and designed to allow the higher mode. The ratio kw of the width Ww of the wide waveguides 102A and 102B divided by the width Wn of the narrow waveguide 101 is preferable 2 or higher, as indicated by Formula (4), in view of improvement in bearing strength of the end face.

$$kw = Ww/Wn \geq 2 \quad (4)$$

Figure 5:
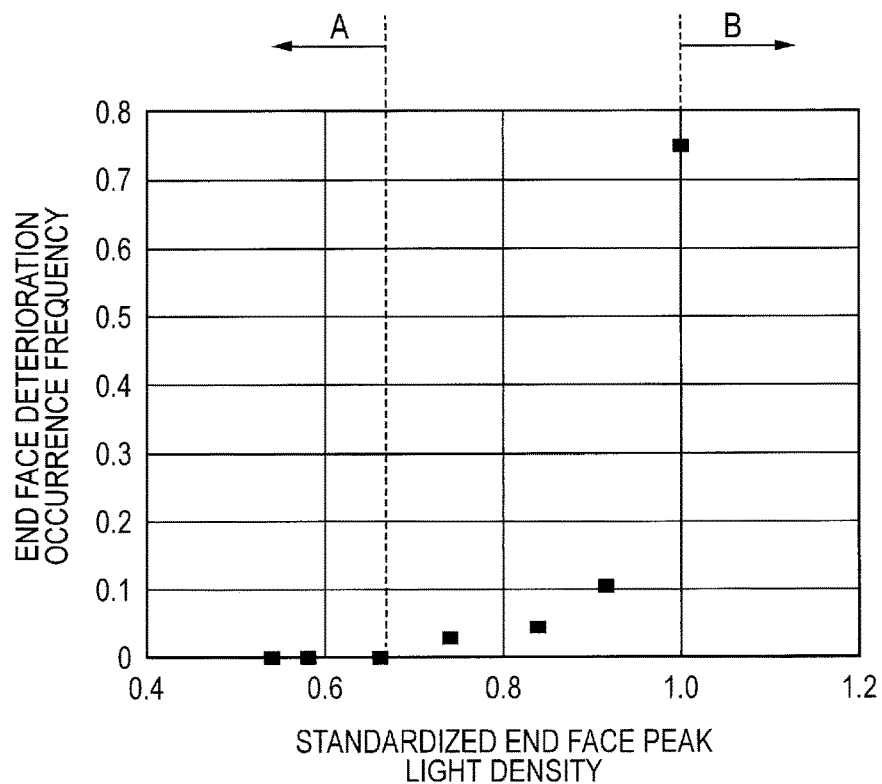
FIG. 5 is a diagram showing light density dependence of end face deterioration in a nitride semiconductor single-mode laser in a 405-nm band.

FIG. 5 is a diagram showing light density dependence of end face deterioration in a nitride semiconductor single-mode laser in a 405-nm band. As shown in FIG. 5, an occurrence frequency of the end face deterioration depends on the light density of the end face, and increases abruptly as it exceeds a certain critical value (region B in FIG. 5). A horizontal axis in FIG. 5 is standardized by the end face light density at the critical value, and the end face deterioration is suppressed in the region where the end face light density is 0.7 times or less of the critical value (region A in FIG. 5). Therefore, for a stable operation in a high light output zone exceeding the critical value, it suffices that the light density at the end face be at least 0.7 times or less.

Figure 6:
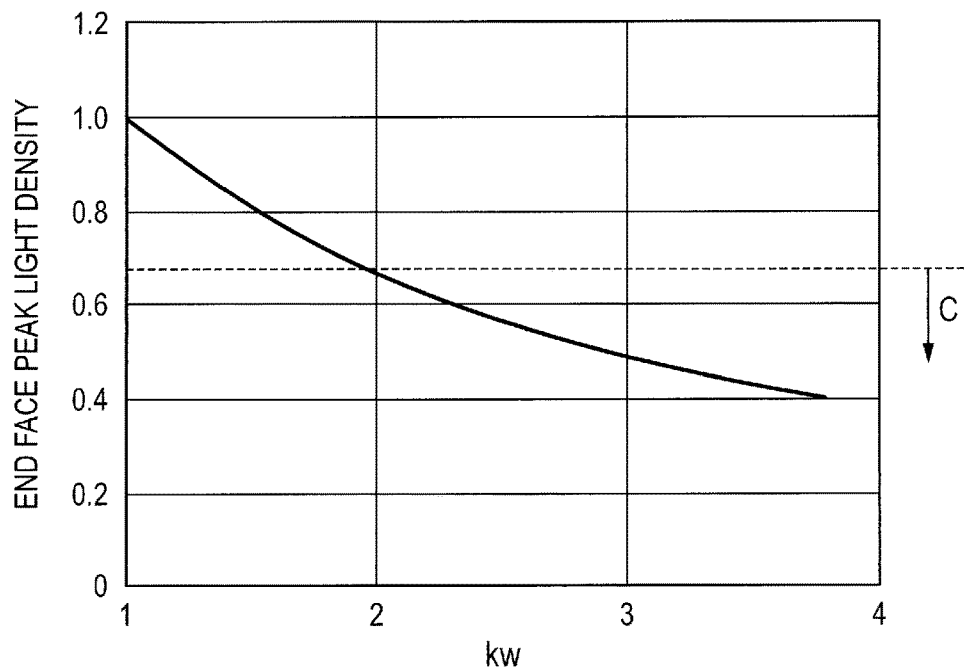
FIG. 6 is a diagram showing a calculation result of the waveguide width dependence of the light density at the end face of the semiconductor laser.

FIG. 6 is a diagram showing a calculation result of the waveguide width dependence of the light density at the end face of the semiconductor laser. It can be seen from FIG. 6 that the end face waveguide width Ww required to suppress the light density at the end face to 0.7 times or less (region C in FIG. 6) of the single-mode laser (i.e. kw=1) is two times or more (kw≥2) of Wn. Therefore, in the light of achieving a stable operation at high power where the end face deterioration frequently occurs in the single-mode laser, the width Ww of the wide waveguides 102A and 102B is preferable two times or more (kw≥2) of the width Wn of the narrow waveguide 101.

Now, to increase the width Ww of the wide waveguides 102A and 102B, namely to increase the above-mentioned ration kw, in the light of the coupling loss and the kink light output of the tapered waveguide, it is required to increase the length Lt of the tapered waveguides 103A and 103B and the length L of the waveguide 110. When the length L of the waveguide 110 is set to 2000 µm or longer (L≥2000 µm), the stable single-mode high-power operation can be achieved by setting the width Ww of the wide waveguides 102A and 102B to 9 µm or more (Ww≥9 µm) and the ratio kw to 6 or higher (kw≥6).

As for a design of a high output laser, the longer the resonator length or the length L of the waveguide 110, the more the operating voltage can be decreased, which is advantageous in the light of power consumption. On the other hand, when the resonator length or the length L of the waveguide 110 is too long, an amount of heat generation is increased by the increase of the operating current and chip yield per wafer is decreased. In view of advantages in the aspect of costs such as requirement for high heat-dissipation design and cooling system, chip yield per wafer, and the like, the resonator length or the length L of the waveguide 110 is desired to be no less than 600 µm and no more than 1600 µm (600 µm≤L≤1600 µm). With the resonator length no less than 600 µm and no more than 1600 µm, by setting the width Ww of the wide waveguides 102A and 102B to no less than 2 µm and no more than 8 µm (2 µm≤Ww≤8 µm) and the ratio kw to no lower than 2 and no higher than 5 (2≤kw≤5), a stable single-mode high-power operation can be achieved.

The length Lt of the tapered waveguides 103A and 103B can be expressed by Formula (5) below using an angle θ between the direction of the resonator (i.e. Y direction) and the tapered waveguides 103A and 103B, the above-mentioned ratio kw, and the width Wn of the narrow waveguide 101.

$$Lt = (kw - 1) \cdot Wn/(2 \cdot \tan \theta) \quad (5)$$

In order to reduce the operating current while minimizing the coupling loss of the basic mode, the angle θ is preferably 1.2° or less (θ≤1.2°), and therefore it is preferred that the length Lt of the tapered waveguides 103A and 103B satisfies Formula (6) below.

$$Lt > 24 \times (kw-1) \times Wn \quad (6)$$

Thus, as described above, taking into account a range of the ratio kw and a range of the width Wn of the narrow waveguide 101, the length Lt of the tapered waveguides 103A and 103B is preferably no less than 40 μm and no more than 200 μm (40 μm ≤ Lt ≤ 200 μm). This makes it possible to reduce the coupling loss of the basic mode.

The length Lw of the wide waveguides 102A and 102B is preferably no less than 5 μm and no more than 15 μm (5 μm ≤ Lw ≤ 15 μm). In this manner, by minimizing the waveguide area while retaining a margin for the cleavage positional accuracy to form the resonator end face (generally on the order of ±1 μm), the kink level can be improved.

A cross-sectional structure of the semiconductor laser 100 is now described with reference to FIGS. 2 and 3. The waveguide 110 is formed over the semiconductor substrate 320. In the semiconductor substrate 320, an n-type cladding layer 302, an n-type guide layer 303, a multi quantum well (Multi Quantum Well: MQW) active layer 304, a cap layer 305, and a p-type guide layer 306 are formed over an n-type GaN substrate 301 in the order.

A p-type cladding layer 307 and a p-type contact layer 308 forming the waveguide 110 of a ridge stripe shape are formed over a part of the p-type guide layer 306 in this order. This ridge stripe functions as a refractive index waveguide mechanism in the horizontal direction (i.e. X direction) and also as a current constriction. A p-electrode 310 is formed over the p-type contact layer 308. A surface of the cap layer 305 where the waveguide 110 is not formed and a lateral side of the waveguide 110 are coated with an insulating film 309. A cover electrode 311 is formed over the p-electrode 310. An n-electrode 312 is formed below the n-type GaN substrate 301.

A method of manufacturing the semiconductor laser 100 is now described below. First, the n-type cladding layer 302 formed of Si-doped n-type $Al_{0.1}Ga_{0.9}N$ ($4 \times 10^{17}$ cm$^{-3}$ Si concentration, 2 μm thickness), the n-type guide layer 303 formed of Si-doped n-type GaN ($4 \times 10^{17}$ cm$^{-3}$ Si concentration, 0.1 μm thickness), the three-cycle multi quantum well (MQW) active layer 304 formed of an $In_{0.15}Ga_{0.85}N$ well layer (3 μm thickness) and a Si-doped $In_{0.01}Ga_{0.99}N$ barrier layer ($1 \times 10^{18}$ cm$^{-3}$ Si concentration, 4 μm thickness), the cap layer 305 formed of Mg-doped p-type $Al_{0.2}Ga_{0.8}N$ ($2 \times 10^{19}$ cm$^{-3}$ Mg concentration, 10 μm thickness), the p-type guide layer 306 formed of Mg-doped p-type GaN ($2 \times 10^{19}$ cm$^{-3}$ Mg concentration, 0.1 μm thickness), the p-type cladding layer 307 formed of Mg-doped p-type $Al_{0.1}Ga_{0.9}N$ ($1 \times 10^{19}$ cm$^{-3}$ Mg concentration, 0.5 μm thickness), and the p-type contact layer 308 formed of Mg-doped p-type GaN ($1 \times 10^{20}$ cm$^{-3}$ Mg concentration, 0.02 μm thickness) are sequentially formed over the n-type GaN substrate 301 using the metal organic chemical vapor deposition (Metal Organic Vapor Phase Epitaxy: MOVPE) or the like.

An etching mask is then formed by the general photolithographic process for forming the waveguide 110. After this, the p-type contact layer 308 and the p-type cladding layer 307 are etched partway by the dry-etching using, for example, chlorine-based gas. This makes the waveguide 110 configured by the ridge stripe having the tapered structure. For the etching depth of the p-type cladding layer 307, because it may affect transverse mode properties, current-light output properties, current-voltage properties and the like of the semiconductor laser device, an optimal value should be selected taking into account the required device properties and the like. In this embodiment, it is adjusted to have two different values of 0.0048 and 0.0036 for the horizontal refractive index difference Δn at a narrow part.

In this embodiment, the resonator length L is 800 μm, the narrow waveguide width Wn is 1.25 μm, and other specific waveguide dimensions are as shown in the table below.

TABLE 1

| Ww (μm) | Lt (μm) | Lw (μm) | ks |
| --- | --- | --- | --- |
| 3 | 200 | 27 | 1.44 |
| 3.5 | 60 | 10 | 1.18 |
| 3.5 | 60 | 35 | 1.29 |
| 4 | 80 | 10 | 1.28 |
| 4 | 80 | 20 | 1.33 |
| 4 | 80 | 30 | 1.39 |
| 4 | 130 | 5 | 1.39 |
| 4.5 | 100 | 5 | 1.36 |
| 4.5 | 80 | 30 | 1.46 |
| 5 | 100 | 5 | 1.41 |

Subsequently, the insulating film 309 such as a silicon oxide film is formed using the CVD method. The insulating film 309 is then removed where the p-electrode 310 should be formed by the general photolithographic process and etching process. Titanium and gold are deposited by, for example, vacuum deposition method, and an alloying process is performed by heating under an appropriate condition, thereby forming the p-electrode 310. In this embodiment, the cover electrode 311 is further formed over the p-electrode 310. The cover electrode 311 may be formed using various metal film forming method such as the vacuum deposition method, the sputtering method and the plating method. A plated pad or the like may further be formed over the cover electrode 311.

Formation of the n-electrode 312 is now described. The n-type GaN substrate 301 is thinned to approximately 100 μm by polishing a back side of the n-type GaN substrate 301. Subsequently the n-electrode 312 is formed on the back side of the n-type GaN substrate 301 by depositing titanium and gold by the vacuum deposition method, for example, and performing the alloying process by heating under an appropriate condition.

The resonator end face 111A (hereinbelow, also referred to as "first end face") and 111B (hereinbelow, also referred to as "second end face") orthogonal to the waveguide 110 are formed by the cleavage. A low reflection film formed of $Al_2O_3$ having 10% reflectance is formed on the resonator end face 111A that is the emission-side end face by, for example, the vacuum deposition method. A high reflection film having 95% reflectance that is a multi-layer film formed of $Al_2O_3$ and ZrO2 is formed on the resonator end face 111B that is the reflection-side end face by, for example, the vacuum deposition method. Subsequently an element isolation is performed to obtain the semiconductor laser 100 having the structure shown in FIGS. 1 to 3.

Figure 7:
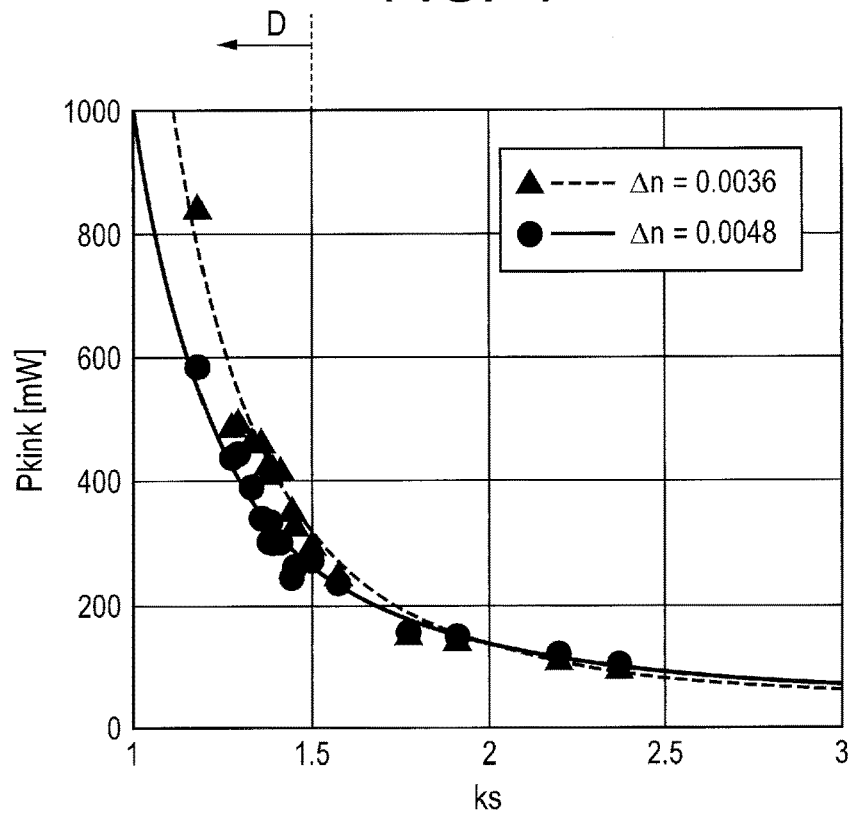
FIG. 7 is a diagram showing a kink light output of the semiconductor laser according to the first embodiment.

Kink suppression in the semiconductor laser 100 according to this embodiment is now described below. FIG. 7 is a diagram showing a kink light output of the semiconductor laser 100 according to the first embodiment. In FIG. 7, a case of ks>1.5 is also shown as a comparison. From FIG. 7, it is found that the kink light output Pkink of the tapered structure strongly depends on the waveguide area S and is approximated to the ration ks by Formula (7) below.

$$Pkink = A \exp[B\{ks/(1+ks)\}] \quad (7)$$

In the comparison of ks>1.5, the kink occurs in a relatively low-power region of P<200 mW and no improvement effect by reduction of Δn is recognized either. To the contrary, with the semiconductor laser 100 according to this embodiment, the kink level is abruptly improved in the region of ks≤1.5 (region D in FIG. 7) and the improvement effect by reduction of Δn is also recognized.

Figure 8:
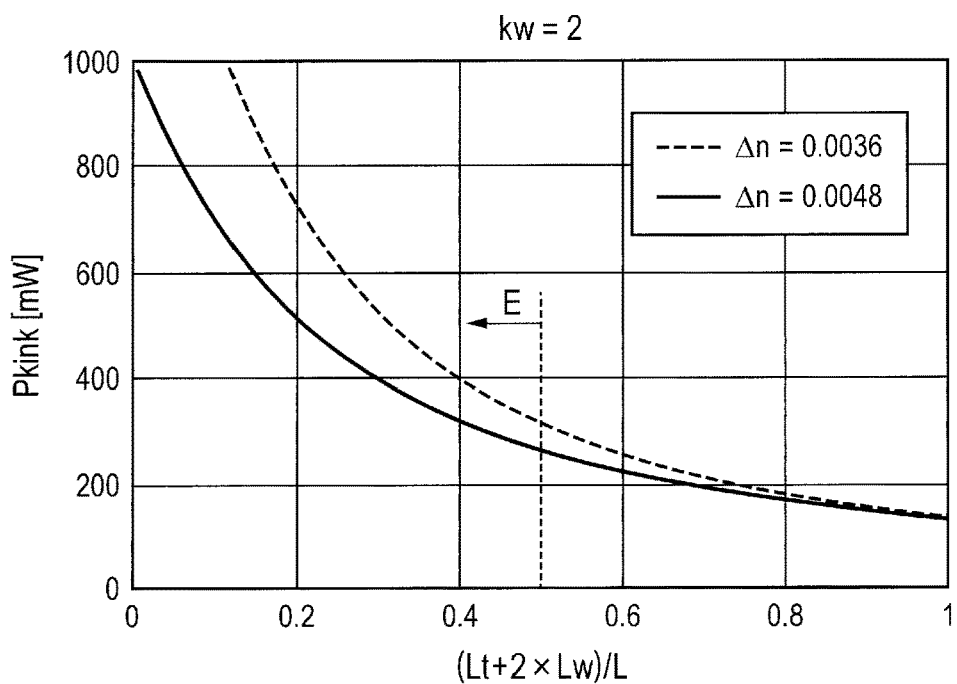
FIG. 8 is a diagram plotting the kink level with respect to (Lt+2Lw)/L when kw=2.
Figure 9:
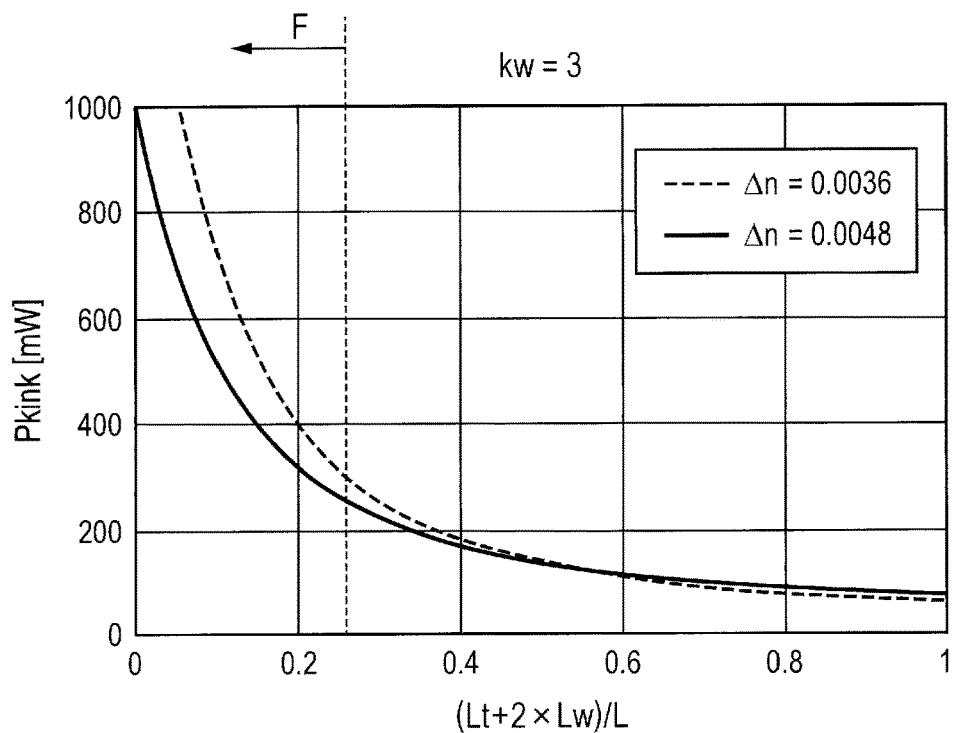
FIG. 9 is a diagram plotting the kink level with respect to (Lt+2Lw)/L when kw=3.
Figure 10:
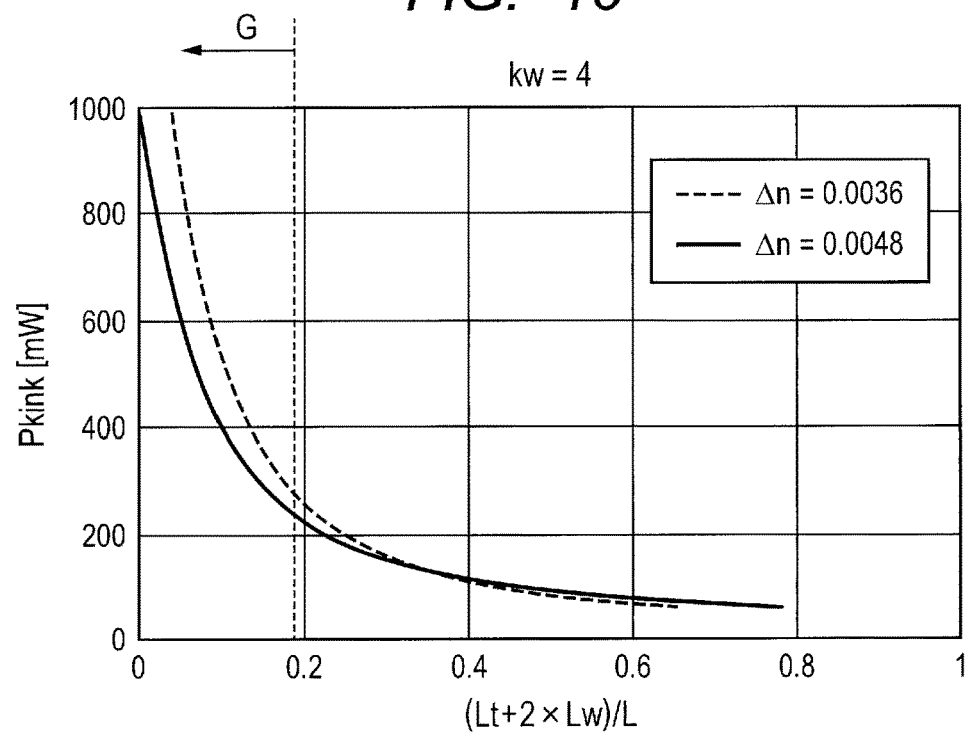
FIG. 10 is a diagram plotting the kink level with respect to (Lt+2Lw)/L when kw=4.

FIGS. 8 to 10 are diagrams plotting the kink power Pkink with respect to (Lt+2Lw)/L when kw=2, 3, and 4, respectively. The value on the horizontal axis indicates an upper limit when ks≤1.5. In FIGS. 8 to 10, the region in which the kink power Pkink is approximately 300 [mW] or higher is indicated by regions E to G, respectively. The upper limit value is expressed by Formula (8) below based on Formula (1) and Formula (3).

$$(Lt+2Lw)/L \leq 0.5/(kw-1) \quad (8)$$

Formula (8) makes it possible to appropriately select the taper length Lt, the wide waveguide length Lw, and the resonator length L for the waveguide width ratio kw required for improving the bearing strength of the end face in the light of improvement of the kink bearing strength improvement.

As described above, with the semiconductor laser according to this embodiment, because the region of the waveguide that allows the higher mode can be reduced by suppressing the area ratio ks to a small value, the super luminescence of the higher mode hardly occurs and thus the kink light output can be greatly improved.

Moreover, with the semiconductor laser 100 according to this embodiment, by suppressing generation of the super luminescence of the higher mode by lowering the waveguide area ratio of the wide waveguide and the tapered waveguide allowing for the higher mode and thus the kink level can be greatly improved, which makes it possible to achieve both the high beam quality and the high power.

Second Embodiment

Figure 11:
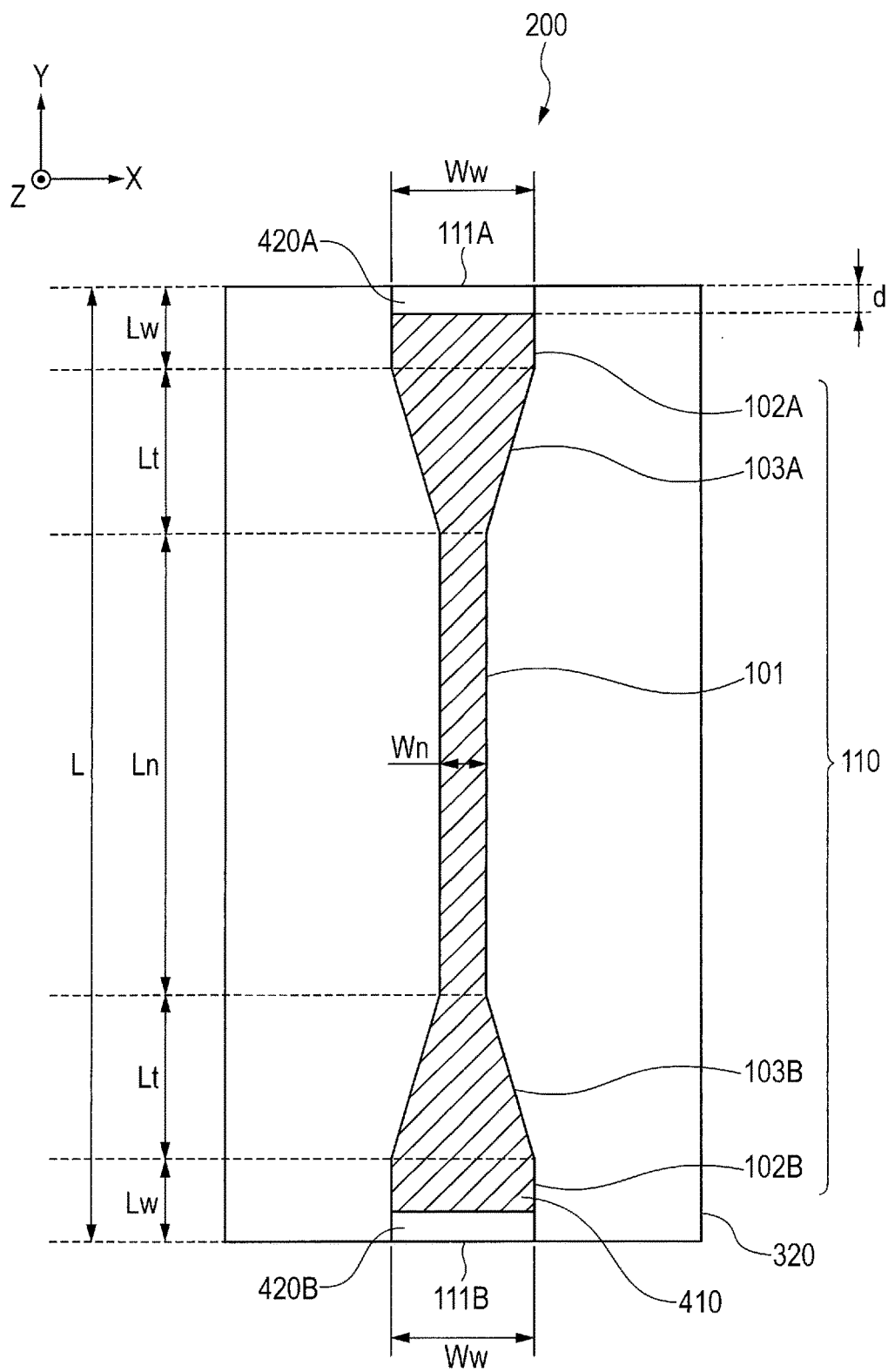
FIG. 11 is a top view schematically showing a configuration of a semiconductor laser according to a second embodiment.

A semiconductor laser 200 according to a second embodiment is described below. FIG. 11 is a top view schematically showing a configuration of the semiconductor laser 200 according to the second embodiment. As shown in FIG. 11, the semiconductor laser 200 has the same configuration as the semiconductor laser 100 except that the p-electrode 310 is replaced by a p-electrode 410.

As described in the first embodiment, the length Lw of the wide waveguides 102A and 102B may vary due to variation of the cleavages. Especially when the value of the ratio kw is large, as can be seen from FIGS. 8, 9, and 10, the change of the kink level with respect to the length Lw of the wide waveguides 102A and 102B is so sharp that an influence by the variation of only ±1 μm cannot be ignored. Therefore, a current constriction structure independent of cleavage is required for stably suppressing generation of the super luminescence in the wide waveguides 102A and 102B.

To the contrary, in this embodiment, a current non-flow region 420A (hereinbelow, also referred to as "first current non-flow region") and 420B (hereinbelow, also referred to as "second current non-flow region") where the p-electrode 410 is not formed are formed near the resonator end faces 111A and 111B, respectively. The carrier density in the current non-flow regions 420A and 420B can be reduced by providing the current non-flow regions 420A and 420B, and thus the kink bearing strength can be improved. A length d of the current non-flow regions 420A and 420B in the Y direction can be, for example, no less than 5 μm and no more than 30 μm (5 μm≤d≤30 μm), or no less than the length Lw of the wide waveguides 102A and 102B (d≥Lw).

As described above, this configuration can suppress the variation of the kink level due to the cleavage variation.

Moreover, by setting the length d of the current non-flow regions 420A and 420B in the Y direction to be no less than Lw of the current non-flow regions 420A and 420B (d≥Lw), the current density of the wide waveguides 102A and 102B can be reduced compared with the case in which the current non-flow regions 420A and 420B are not provided, and thus the generation of the super luminescence can be suppressed, whereby the kink level can be further improved.

Third Embodiment

Figure 12:
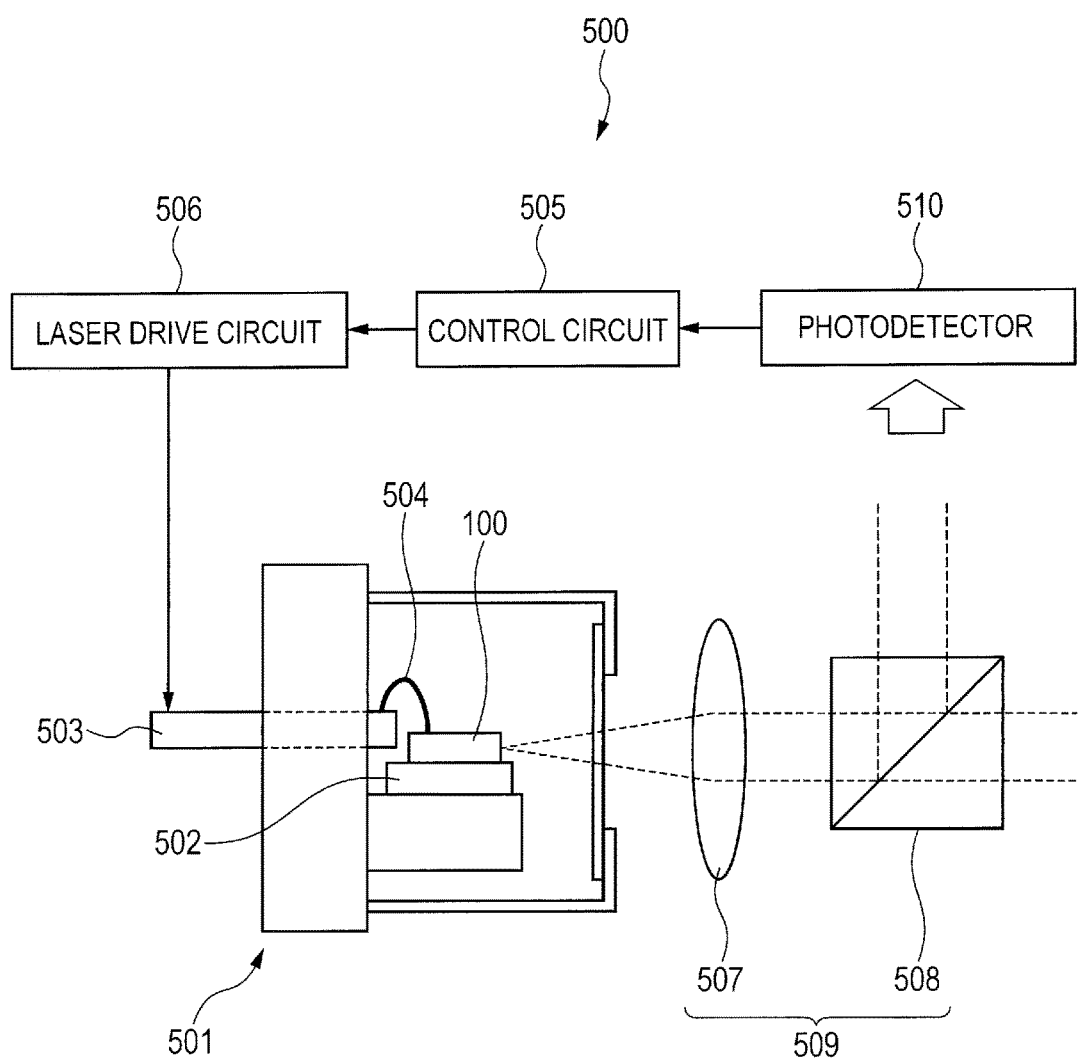
FIG. 12 is a diagram schematically showing a configuration of a light source unit according to a third embodiment.

A light source unit 500 according to a third embodiment is described below. The light source unit 500 is configured as a light source unit that uses the semiconductor laser 100 according to the first embodiment described above as its light source. FIG. 12 is a diagram schematically showing a configuration of the light source unit 500 according to the third embodiment.

As shown in FIG. 12, the semiconductor laser 100 is mounted over a submount 502 in a CAN package 501 and coupled via an electrode 503 and a bonding wire 504. A control circuit 505 controls a laser drive circuit 506 appropriately and the laser drive circuit 506 applies drive voltage to the electrode 503, whereby the semiconductor laser 100 emits a laser light.

The laser light emitted from the semiconductor laser 100 is output from the light source unit 500 via an optical system 509 including, for example, a lens 507 and a beam splitter 508. The laser light transmitted through the beam splitter 508 is output to the outside of the light source unit 500, and a part of the laser light reflected by the beam splitter 508 enters a photodetector 510. The photodetector 510 detects intensity of the incident laser light, and outputs the detection result to a control circuit 505. Thus, by referring to the detection result from the photodetector 510, the control circuit 505 can perform feedback control so that the intensity of the laser light emitted from the semiconductor laser 100 can be within a desired range.

As described above, this configuration makes it possible to configure the light source unit using the semiconductor laser according to the above embodiment.

Fourth Embodiment

Figure 13:
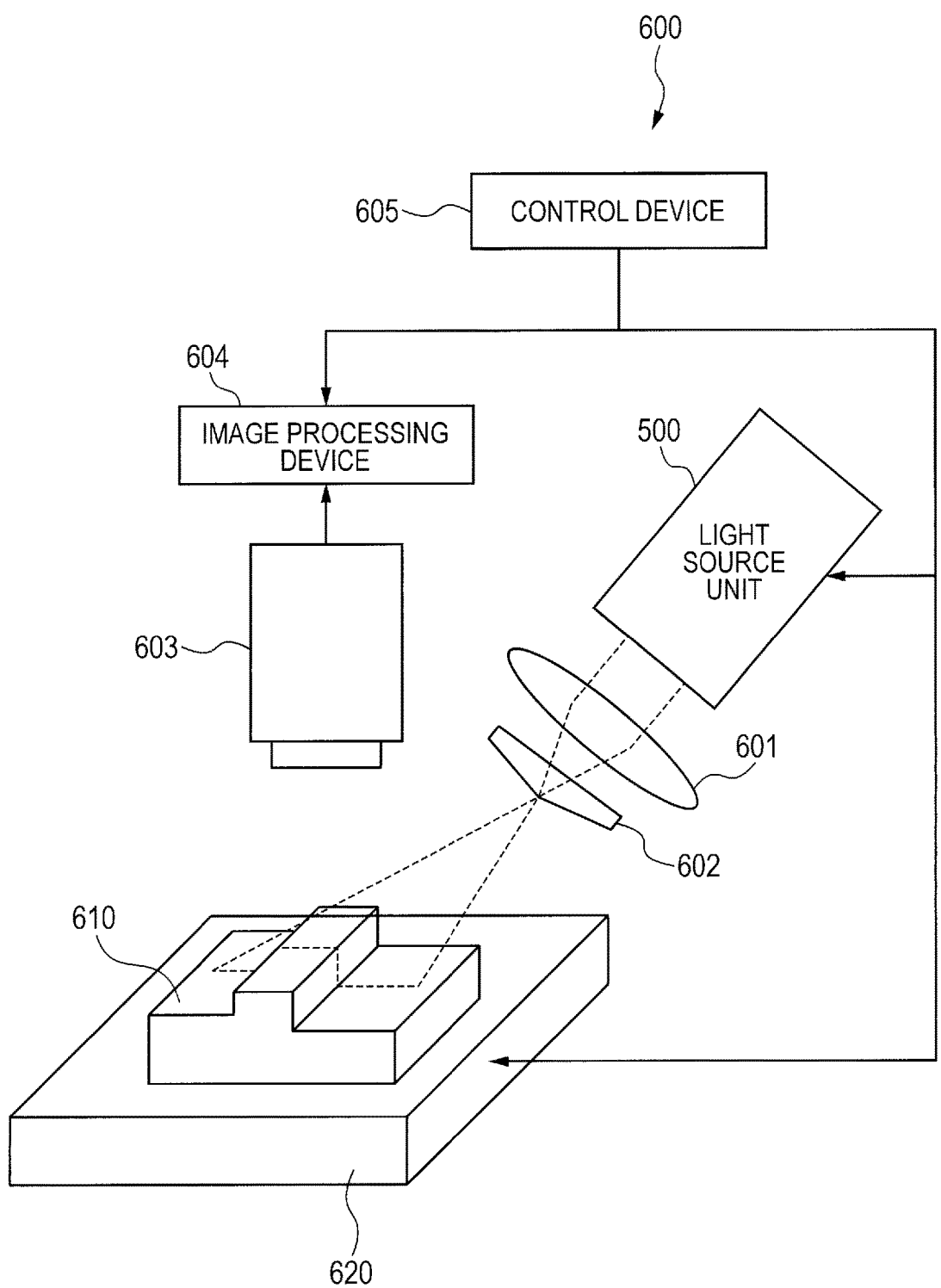
FIG. 13 is a diagram schematically showing a configuration of a measurement device according to a fourth embodiment.

A laser light irradiation device according to a fourth embodiment is described below. Described herein is a measurement device 600 mounted with the light source unit 500 according to the third embodiment. FIG. 13 is a diagram schematically showing a configuration of the measurement device 600 according to the fourth embodiment.

As shown in FIG. 13, the laser light emitted from the light source unit 500 transmits through a condenser lens 601 and a line lens 602, for example, and is irradiated onto a measurement object 610 placed on a movable stage 620. For example, an imaging unit 603 configured by a CCD detects the laser light reflected by the measurement object 610 and outputs the detection result to an image processing device 604.

A control device 605 can perform a measurement process depending on the shape of the measurement object 610 and the measurement condition by controlling operations of the light source unit 500, the movable stage 620, and the image processing device 604.

Thus, the image processing device 604 can obtain an image of the measurement object 610 based on the detection result and measure the dimension of each part of the measurement object 610 based on the obtained image.

As described above, this embodiment makes it possible to configure the measurement device using the light source unit according to the above embodiment. Moreover, it is advantageous in that performance of the equipment can be improved (high speed, various sizes and types of the measurement object, improved reliability, and the like) by using a high-power light source, by mounting the light source unit according to the above embodiment on an industrial or medical sensor equipment, analyzer, or the like.

Fifth Embodiment

Figure 14:
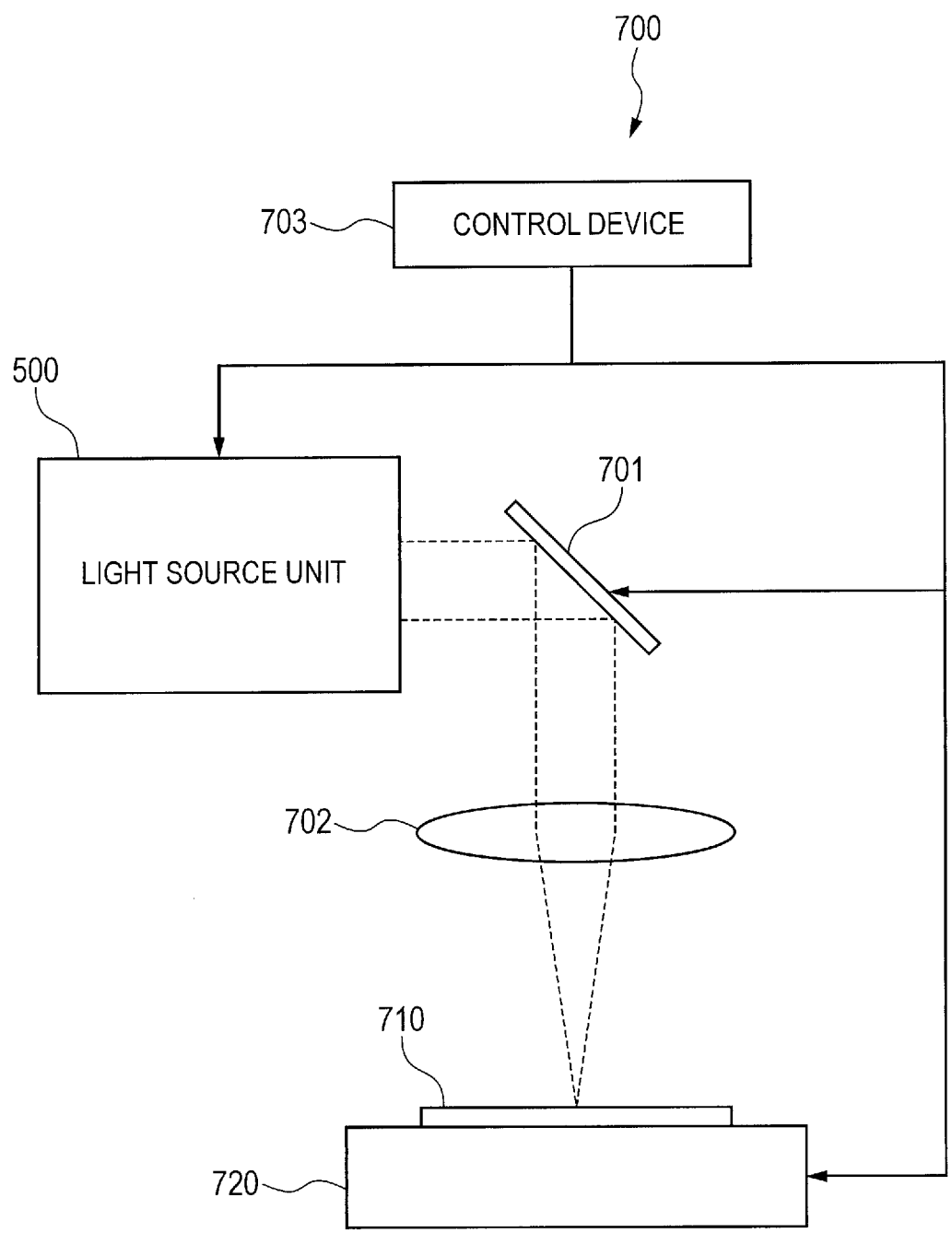
FIG. 14 is a diagram schematically showing a configuration of a lithography device according to a fifth embodiment.
Figure 15:
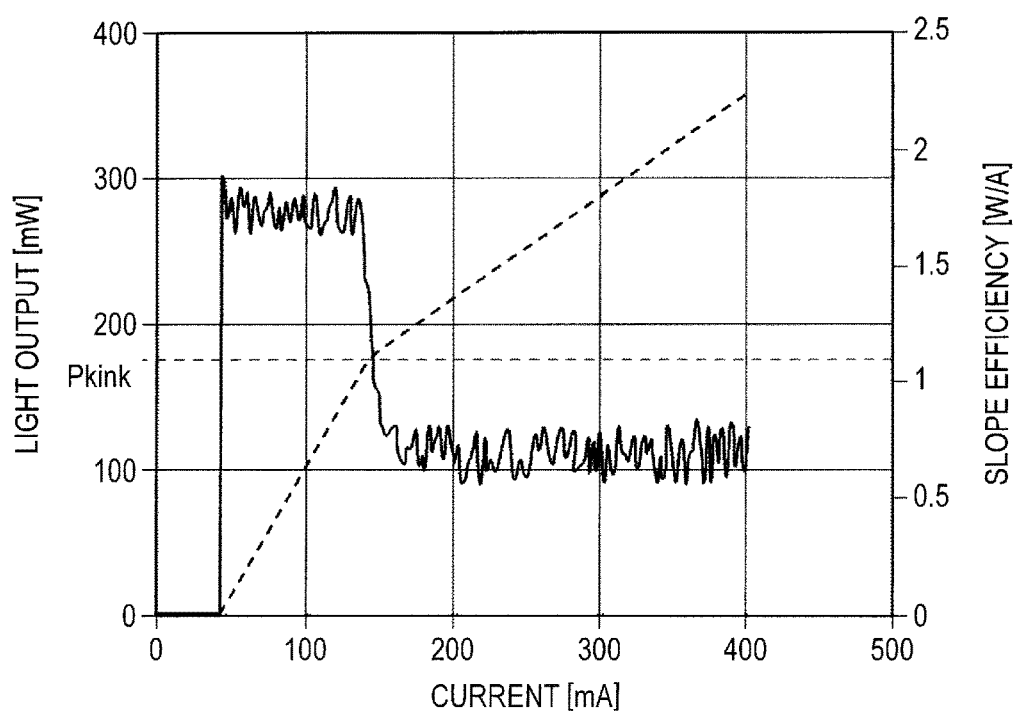
FIG. 15 is a diagram showing a current-light output (I-L) property of a laser introduced with a typical tapered waveguide structure.
Figure 16:
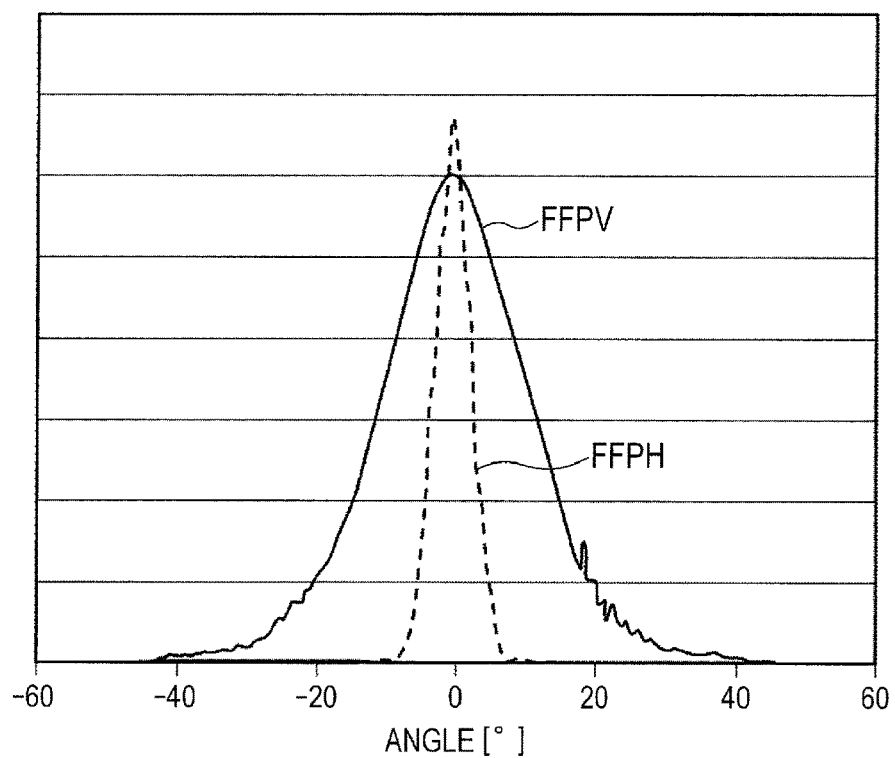
FIG. 16 is a diagram showing a far-field image of a laser light emitted from the semiconductor laser introduced with the typical tapered waveguide structure.

A laser light irradiation device according to a fifth embodiment is described below. Described herein is a lithography device 700 mounted with the light source unit 500 according to the third embodiment. FIG. 14 is a diagram schematically showing a configuration of the lithography device 700 according to the fifth embodiment.

As shown in FIG. 14, the laser light emitted from the light source unit 500 is directed to an object 710 placed on a movable stage 720 by a MEMS (Micro Electro Mechanical Systems) mirror 701. The laser light reflected by the MEMS mirror 701 is collected on the object 710 by a condenser lens 702.

A control device 703 can control a path along which the laser light scans the object 710 by controlling operations of the light source unit 500, the movable stage 720, and the MEMS mirror 701.

For example, the object 710 is coated with a photosensitive material such as a photoresist in advance, and a drawing pattern can be obtained by performing a development process after drawing with the laser light using the lithography device 700.

As described above, this configuration makes it possible to configure the lithography device using the light source unit according to the above embodiment. Moreover, it is advantageous in that performance can be improved such as high-speed processing, increased size of the object to be processed, increased variety, improvement of reliability, and the like, by mounting the light source unit described above on a direct drawing type of exposure device, printer, precision processing equipment (for example, 3D printer) or the like, as an application of this configuration.

It should be noted that the invention is not limited to the above embodiments but can be appropriately modified without departing from the scope of the invention. For example, although the above embodiment takes an example of the nitride semiconductor-based 405 nm band blue-violet laser, the wavelength band and materials are not limited to this example. For example, as for materials, it is needless to say that the similar waveguide configuration can be applied to the semiconductor lasers based on other compound semiconductors based on GaAs, InP, or the like.

Moreover, while the above embodiment takes an example of the ridge striped semiconductor laser, it is needless to say that the waveguide structure described in the above embodiment can be applied to the semiconductors having other structures such as an embedded laser having a waveguide embedded in the cladding layer or the like.

Furthermore, while the layer structure of the semiconductor laser is described with reference to FIGS. 2 and 3, the invention is not limited to this example. As long as it operates as a semiconductor laser, other layers may be added or some layers may be removed. It is also possible to replace the conductivity types of the semiconductor layers.

Although the present invention was specifically described based on the embodiments above, it is needless to say that the invention is not limited to the already described embodiments but various modifications can be made without departing from the scope of the invention.

What is claimed is:

1. A semiconductor laser comprising:
   a first waveguide having a first width extending in a longitudinal direction of a resonator;
   a second waveguide extending from a first end face of the resonator in the longitudinal direction of the resonator and having a second width wider than the first width;
   a third waveguide extending from a second end face of the resonator in the longitudinal direction of the resonator and having the second width;
   a first tapered waveguide having a continuously varying width so as to couple the first waveguide and the second waveguide; and
   a second tapered waveguide having a continuously varying width so as to couple the first waveguide and the third waveguide,
   wherein, $W_n$ is the first width as $W_n$, L is a total length of the first to third waveguides and the first and second tapered waveguides in the longitudinal direction of the resonator, which is the length of the resonator, and S is a total area of the first to third waveguides and the first and second tapered waveguides seen perpendicular to a semiconductor substrate on which the first to third waveguides and the first and second tapered waveguides are formed as S, and
   wherein Formula (1) and Formula (2) described below are satisfied:

$$ks = S/(W_n \cdot L) \quad (1)$$

$$1 < ks \le 1.5 \quad (2),$$

where $ks$ is an area ratio.

2. The semiconductor laser according to claim 1,
   wherein, $W_w$ is the second width, and
   wherein Formula (3) described below is satisfied:

$$kw = W_w/W_n \ge 2 \quad (3),$$

wherein $kw$ is a width ratio.

3. The semiconductor laser according to claim 2,
   wherein, $L_t$ is a length of the first and second tapered waveguide in the longitudinal direction of the resonator and $L_w$ is a length of the second and third waveguides in the longitudinal direction of the resonator, and
   wherein Formula (4) described below is satisfied:

$$(L_t + 2L_w)/L \le 0.5/(kw - 1) \quad (4).$$

4. The semiconductor laser according to claim 3,
   wherein the total length L of the first to third waveguides and the first and second tapered waveguides in the longitudinal direction of the resonator is 2000 µm or longer,
   wherein the second width $W_w$ is 6 µm or wider, and
   wherein $kw$ is 6 or more.

5. The semiconductor laser according to claim 3,
   wherein the total length L of the first to third waveguides and the first and second tapered waveguides in the longitudinal direction of the resonator is no less than 600 µm and no more than 1600 µm,
   wherein the second width $W_w$ is no less than 2 µm and no more than 6 µm, and
   wherein $kw$ is no less than 2 and no more than 5.

6. The semiconductor laser according to claim 3,
   wherein the each length $L_t$ of the first and second tapered waveguides in the longitudinal direction of the resonator is no less than 40 µm and no more than 200 µm.

7. The semiconductor device according to claim 3,
   wherein the length $L_w$ of the second and third waveguides in the longitudinal direction of the resonator is no less than 5 µm and no more than 150 µm.

8. A semiconductor laser according to claim 1,
wherein the second waveguide is provided with a first current non-flow region to which electric current is not flowed in a predetermined range from the first end face, and
wherein the third waveguide is provided with a second current non-flow region to which electric current is not flowed in a predetermined range from the second end face.

9. The semiconductor laser according to claim 8, further comprising:
an electrode formed over the first to third waveguides and the first and second tapered waveguides and flowing electric current into the first to third waveguides and the first and second tapered waveguides,
wherein one end of the electrode on the first end face side in the longitudinal direction of the resonator is spaced from the first end face by a predetermined distance, and
wherein another end of the electrode on the second end face side in the longitudinal direction of the resonator is spaced from the second end face by the predetermined distance.

10. The semiconductor laser according to claim 9,
wherein a width of the first and second current non-flow region is larger than a length of the second and third waveguide in the longitudinal direction of the resonator.

11. A light source unit comprising the semiconductor laser according to claim 1.

12. A laser light irradiation device comprising the light source unit according to claim 11 and irradiates a laser light emitted from the light source unit onto an object.

* * * * *